(12) United States Patent
Jeon

(10) Patent No.: US 6,385,078 B2
(45) Date of Patent: May 7, 2002

(54) FERROELECTRIC RANDOM ACCESS MEMORY (FRAM) DEVICE AND METHOD FOR CONTROLLING READ/WRITE OPERATIONS THEREOF

(75) Inventor: Byung-Gil Jeon, Kyunggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/819,125

(22) Filed: Mar. 27, 2001

(30) Foreign Application Priority Data

May 10, 2000 (KR) ........................................ 2000-25100

(51) Int. Cl.[7] ............................................... G11C 11/22
(52) U.S. Cl. ..................... 365/145; 365/194; 365/233.5
(58) Field of Search ................................ 365/145, 149, 365/194, 233.5

(56) References Cited

U.S. PATENT DOCUMENTS 5,943,257 A * 8/1999 Jeon et al. .................. 365/145

* cited by examiner

Primary Examiner—Huan Hoang
(74) Attorney, Agent, or Firm—Marger Johnson & McCollom, P.C.

(57) ABSTRACT

In a ferroelectric random access memory (FRAM) device of the present invention, an address transition detection circuit generates a pulse signal in response to a transition of a row address latched in an address latch circuit, and a flag signal generating circuit generates a chip enable flag signal in response to an external chip enable signal. A delay circuit delays the pulse signal for a predetermined time. After the external chip enable signal is enabled, a controller controls a row decoder circuit in a disabled state when the external chip enable signal is disabled during a delay time of the delay circuit, and controls the flag signal generating circuit to disable the chip enable flag signal. The reliability of the FRAM device is therefore improved by providing it with noise immunity, as when the external chip enable signal is improperly enabled.

15 Claims, 8 Drawing Sheets

FERROELECTRIC RANDOM ACCESS MEMORY (FRAM) DEVICE AND METHOD FOR CONTROLLING READ/WRITE OPERATIONS THEREOF

This application claims priority from Korean Patent Application No. 2000-25100, filed on May 10, 2000, the contents of which are herein incorporated by reference in their entirety.

FIELD OF THE INVENTION

The present invention relates generally to semiconductor integrated circuit (IC) devices, and more particularly to a ferroelectric random access memory (FRAM) device.

BACKGROUND OF THE INVENTION

In recent years, a non-volatile memory which holds data even in a power-off state has been realized by using a ferroelectric material having a hysteresis characteristic such as PZT. More recent work with ferroelectric-based random access memory devices (FRAM) have shown many advantages over other memory technologies: FRAM is able to operate in high-speed with low-voltage, ferroelectric-based memories do not require an overly complicated construction, and FRAMs allow non-volatile storage.

The operational speed of FRAM is typically dependent upon the time it takes the ferroelectric material to undergo a polarization reversal. The polarization reverse speed is dependent on a square measurement of capacitor plates and the thickness of the ferroelectric thin film used to form the FRAM as well as the voltage applied to the device. Experiments have shown that FRAM is far faster than other non-volatile technologies such as EEPROM or flash memory.

FIG. 1 is a block diagram of a conventional FRAM device. The FRAM includes a memory cell array 10 that includes a plurality of memory cells (MC) that are arranged in rows and columns. FIG. 1 shows a section of one of these memory cell rows, where each cell is comprised of an access transistor 11 (or a switching transistor) and a ferroelectric capacitor 12. One memory cell composed of one transistor and one capacitor (1T/1C) stores one bit of data. The access transistor 11 includes a drain connected to an electrode of the ferroelectric capacitor 12, a source connected to a column/bit line (BL), and a gate coupled with a row/wordline (WL). The other electrode of the ferroelectric capacitor 12 is connected with a late line (PL). Wordlines WLs and plate lines PLs arranged in the memory cell array are connected to a row main decoder 20.

FIG. 2 a plot of a hysteresis loop showing a characteristic of the ferroelectric material used between the ferroelectric capacitor 12 electrodes. The abscissa (axis P) represents a potential difference between two electrodes of the ferroelectric capacitor, i.e. a voltage across the plates of the capacitor. The ordinate (axis V) represents a quantity of electric charge retained on a surface of the ferroelectric material by spontaneous polarization where the polization is expressed as $\mu C/cm^2$ units.

In an operation of a memory cell, if the ferroelectric material of a ferroelectric capacitor is in an initial state wherein zero volts is applied, the magnetic domains within the material retain an non-uniform state, and are not directed to any particular polarity. If a positive voltage is applied across the capacitor, however, then the capacitor will conduct current and move to a new positive polarization point A. At point A, the quantity of charge held in the ferroelectric material (i.e. the polarization) is Qs, and the voltage across the capacitor is the operating voltage Vcc. Thereafter, when the voltage across the capacitor returns to zero, the polarization only decreases slightly to point B rather than falling completely to zero. The ferroelectric material thus retains a residual polarization of Qr when the voltage across the ferroelectric capacitor is reduced to zero.

Next, if a negative voltage is applied across the capacitor, the polarization degree moves from point B to a negative charge polarization region shown in FIG. 2 at point C, where all domains of the ferroelectric material are oppositely polarized to that at point A. Here, the polarization is indicated -Qs, and the voltage across the capacitor is -Vcc. Thereafter, when the voltage returns to zero, the polarization moves only slightly to point D rather than falling to zero. Here, the residual polarization thereof is indicated as -Qr. If the voltage again later increases to the positive level, the polarization of the ferroelectric material moves from point D to point A.

FRAMs thus exhibit non-volitile memory characteristics. Once a voltage for generating an electric field is applied to the ferroelectric capacitor with a ferroelectric material positioned between two electrodes, the polarization level is maintained even when the electrodes are established on a floating state. There is no natural loss caused from such a leakage in the surface charge of the ferroelectric material. Accordingly, the polarization level is retained so long as a voltage in opposite level is not applied for the polarization to be zero.

Returning to FIG. 1, the FRAM device further includes a row address latch circuit 30, a column address latch circuit 40, a row pre-decoder circuit 50, a column decoder circuit 60, a chip enable buffer circuit 70, a read/write control circuit 80, a sense amplifier circuit 90, a data output buffer & write driver circuit 100, and an input/output latch circuit 110. The row pre-decoder circuit 50 and a column decoder circuit 60 comrpise a row decoder circuit.

FIG. 3A is a timing diagram showing a normal operation of the FRAM device. In a circuit operation, the chip enable buffer circuit 70 enables a chip enable flag signal ICE to transition from a low level to a high level in response to a high-to-low transition of a external chip enable signal XCEB. A high level ICE signal causes each of the row and column address latch circuits 30 and 40 to latch a corresponding valid address. The row pre-decoder circuit 50 and the row main decoder circuit 20 enable a row or a wordline WL corresponding thereto in response to a row address RAi/RAiB (i≧1) which is latched in the row address latch circuit 30.

Next, as shown in FIG. 3A, a plate line PL corresponding to the selected row or the enabled wordline is activated. It causes thereby the ferroelectric capacitors of the memory cells connected to the selected wordline to have the polarization at point D shown in FIG. 2. The sense amplifier circuit 90 amplifies the voltages on each of the bit lines in response to a control signal SAEN provided from the read/write control circuit 80. The data output buffer of the data output buffer & write driver circuit 100 provides the amplified voltages on the columns or the bit lines selected by the column decoder circuit 60 to the outside as a read data. After the external chip enable signal XCEB is disabled (transitioning from a low level to a high level), the plate line PL disabled thereby disabling the control signal SAEN, the chip enable flag signal ICE, the outputs of the row address latch circuit 30, and the wordline WL. With those signals disabled, the read/write operation is terminated.

The latches in the FRAM device for latching a current memory address are controlled by the chip enable flag signal ICE, which in turn is activated by a high-to-low transition of the external chip enable signal XCEB. It is thus critical to the proper operation of this type of conventional FRAM that the ICE signal be activated at the correct time. It is important to understand, however, that the generated signal ICE maintains an enable state for a predetermined time regardless of a subsequent change of the external chip enable signal XCEB because a predetermined time is required for restoring the original data which has been damaged by a destructive read operation of the FRAM device. Accordingly, the chip enable flag signal ICE will be disabled in conventional FRAM devices only when two events occur: (1) the predetermined amount of time has passed and (2) the external chip enable signal XCEB is disabled.

FRAM devices designed in this way have an important drawback. When a noise spike or an abnormally short pulse occurs in the external chip enable signal XCEB, an unnecessary read/write operation is performed.

FIG. 3B is a timing diagram to show an abnormal operation of the FRAM device. When the external chip enable signal XCEB is abnormally applied to the chip enable buffer circuit 70 (e.g. as a short noise or short pulse), the chip enable flag signal ICE is enabled by undergoing a low-to-high level transition. The row address latch circuit 30 then latches a current established address or an invalid address in response to the chip enable flag signal ICE. Thereafter, the read/write operation is performed for a predetermined time as described above, regardless of a subsequent low-to-high transition of the external chip enable signal XCEB. The resulting noise signal (the short high-to-low-to-high transition) causes an undesirable latching and read/write operation. Under such an example, invalid data is written in or read from undesirable memory cells by inappropriately activated write enable signal XWEB or a read enable signal. Thus, the read/write operation is invalid thus decreasing the reliability of the FRAM device.

SUMMARY OF THE INVENTION

It is therefore an object of the present invention to improve the reliability of ferroelectric random access memory (FRAM) devices by designing FRAMS with noise immunity.

It is another object of the invention to provide a method for controlling read/write operations of the FRAM device to prevent false operations caused by noise spikes.

In order to attain the above object according to an aspect of the present invention, there is provided a method for controlling a read/write operation of the FRAM device, including an array consisted of a plurality of memory cells, arranged in rows and columns, each having a ferroelectric capacitor and an access transistor, including a step of enabling a chip enable flag signal when a chip enable signal is enabled. Then, a row address latch circuit of the FRAM device is enabled to latch row address signals in response to the chip enable signal. Next, a pulse signal is generated according to a transition of at least one of the row address signals latched in the row address latch circuit. After the pulse signal is delayed for a predetermined time, whether or not the chip enable signal is disabled during the delay period of the pulse signal is detected. If the chip enable signal is disabled during the delay period of the pulse signal, a row decoder circuit of the FRAM device maintains a disabled state. On the contrary, if the chip enable signal is not disabled during the delay period of the pulse signal, the row decoder circuit is enabled for one of the rows to be selected.

According to another aspect of this invention, there is provided a ferroelectric random access memory (FRAM) device including: an array consisted of a plurality of memory cells, arranged in rows and columns, each having a ferroelectric capacitor and an access transistor; an address latch circuit to latch a row address in response to a chip enable flag signal; a row decoder circuit to select one of the rows by decoding the latched row address; an address transition detection circuit to generate a pulse signal in response to a transition of the row address latched in the address latch circuit; a flag signal generating circuit to create the chip enable flag signal in response to the external chip enable signal; a delay circuit to delay the pulse signal for a predetermined time; and a controller to control the row decoder circuit and the flag signal generating circuit when the external chip enable signal is enabled. After the external chip enable signal is enabled, the controller controls the row decoder circuit in a disabled state if the external chip enable signal is disabled during a delay period of the delay circuit, and controls the flag signal generating circuit for the chip enable flag signal to be disabled.

According to the FRAM device of the present invention, the FRAM device is able to prevent an unnecessary operation of the FRAM device resulted from the external chip enable signal which is abnormally enabled, as a short pulse or a short noise, and thereby improve a noise immunity.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
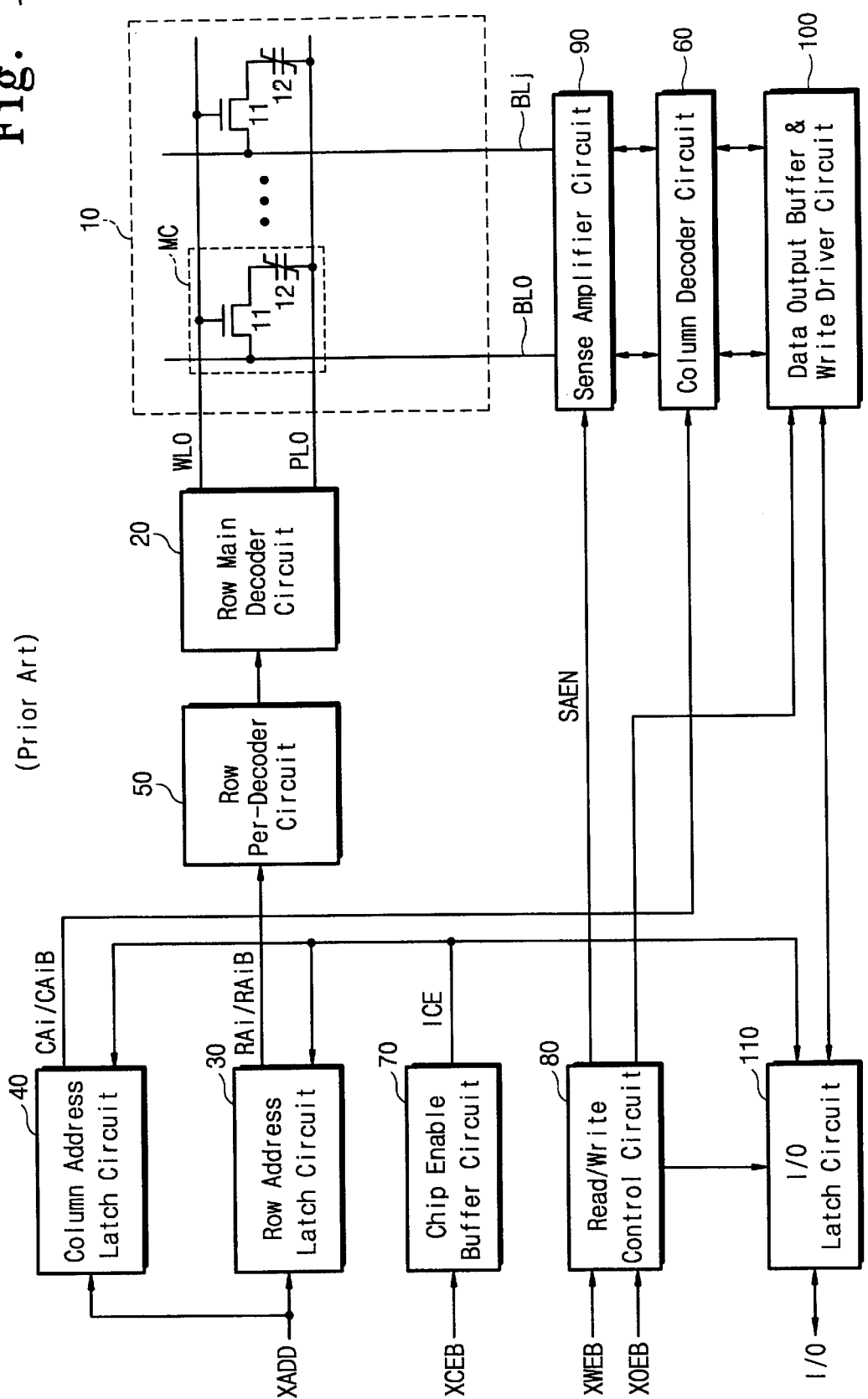
FIG. 1 is a block diagram of a general ferroelectric random access memory (FRAM)
Figure 2:
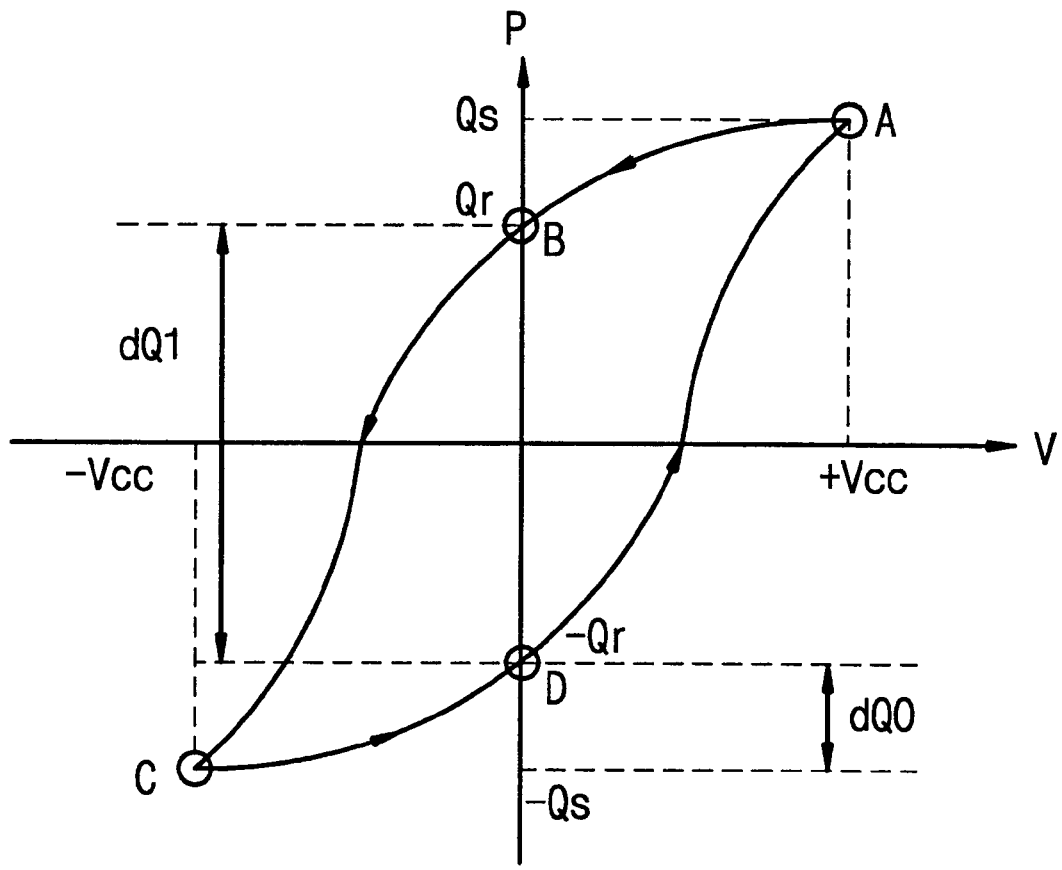
FIG. 2 is a plot of a hysteresis loop showing a characteristic of a ferroelectric material positioned between ferroelectric capacitor electrodes.
Figure 3A:
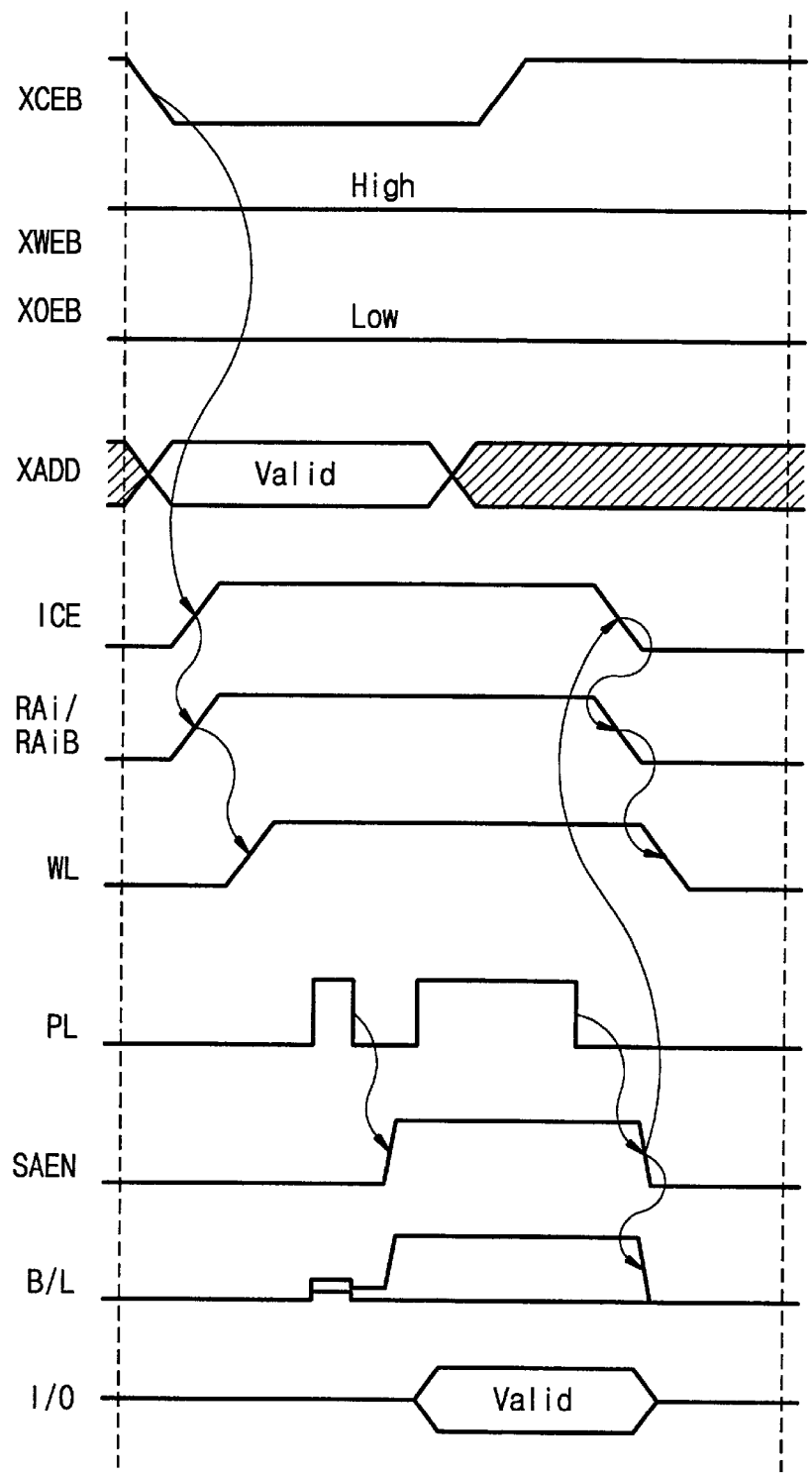
FIG. 3A is a timing diagram showing a write operation in a normal state of the FRAM shown in FIG. 1.
Figure 3B:
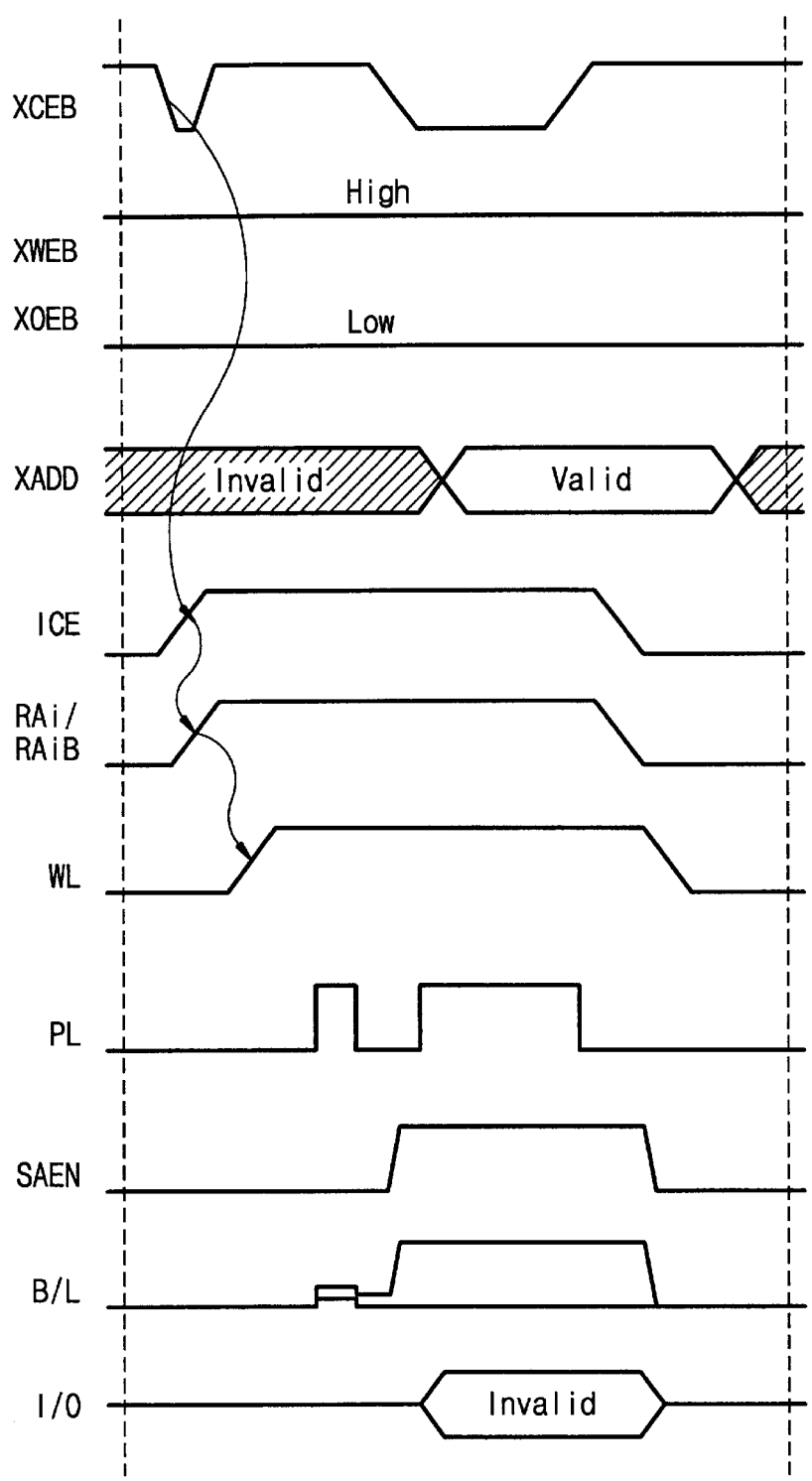
FIG. 3B is a timing diagram showing a write operation in an abnormal state of the FRAM shown in FIG. 1.
Figure 4:
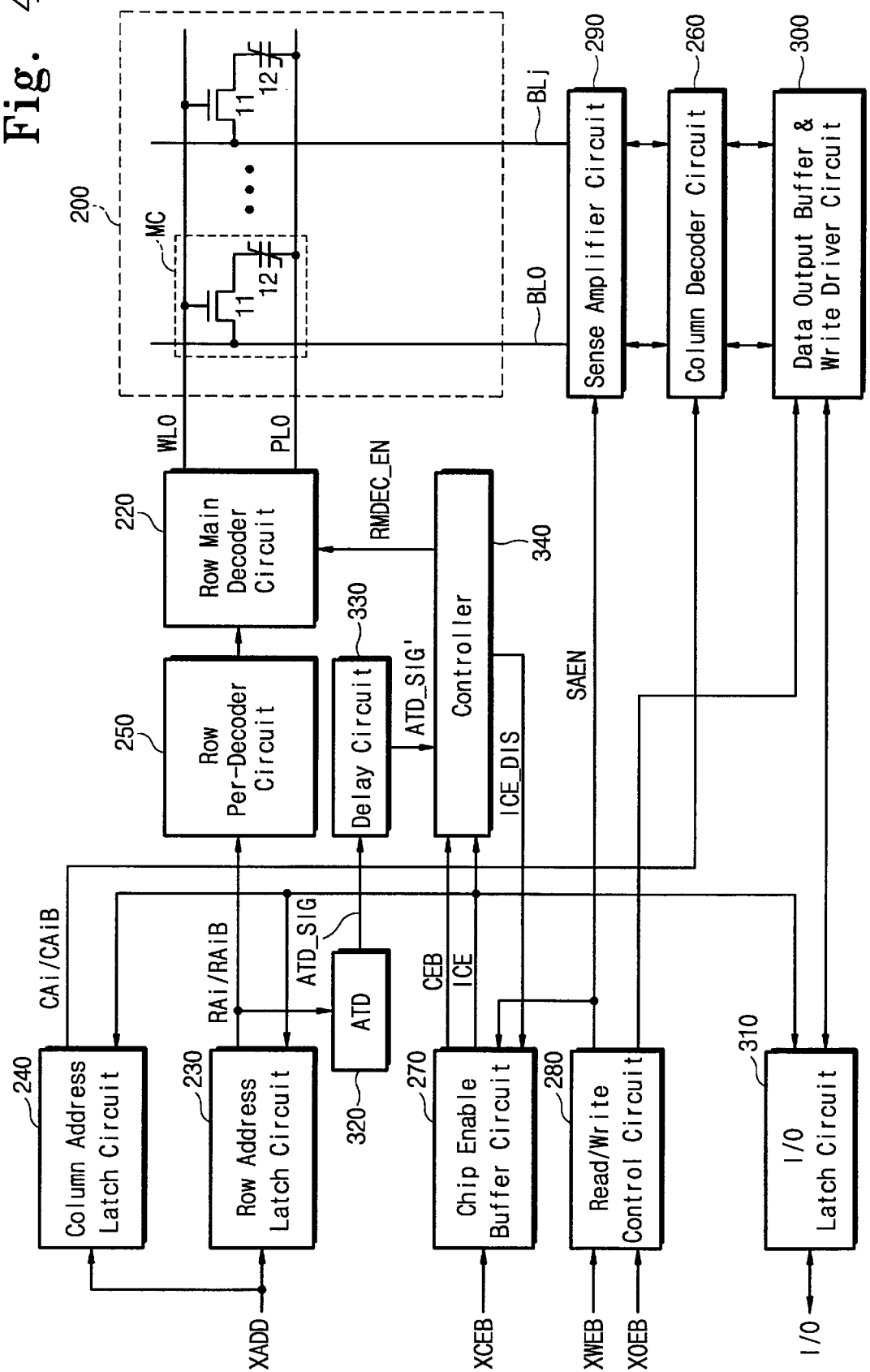
FIG. 4 is a block diagram of a FRAM constructed according to a preferred embodiment of the present invention.

FIG. 4 is a block diagram of a ferroelectric random access memory (FRAM) device constructed according to a preferred embodiment of the present invention. Compared with the memory device shown in FIG. 1, the preferred FRAM device of the present invention further comprises an address transition detection circuit 320, a delay circuit 330, and a controller 340. Excluding a function of the controller 340 which controls a row main decoder circuit 220 and a chip enable buffer circuit 270, functions of the rest of components shown in FIG. 4 can be the same with those of the components shown in FIG. 1, and therefore the description of those components are omitted here.

Referring to FIG. 4, the address transition detection circuit (ATD) 320 generates a detection pulse signal ATD__SIG when at least one of the output signals RAi/RAiB (i≧1) from a row address latch circuit 230 is enabled by a chip enable flag signal ICE generated by the chip enable buffer circuit 270. The detection pulse signal ATD__SIG is delayed for a predetermined time by the delay circuit 330, and a delayed version of a detection pulse signal ATD_SIG' provided from the delay circuit 330 is supplied to the controller 340. The controller 340 generates control signals where a control signal RMDEC__EN controls an enable/disable operation of a row main decoder circuit 220, and a control signal ICE__DIS controls a disable operation of the output signal ICE of the chip enable buffer circuit 270, in response to signals CEB and ICE of the chip enable buffer circuit 270 and a signal ATD__SIG' of the delay circuit 330.

The controller 340 determines whether an external chip enable signal XCEB is normally enabled or not in response to the signals CEB, ICE, and ATD__SIG' as described in further detail below. If the external chip enable signal XCEB is abnormally enabled as by a noise spike, the controller 340 operates to prevent the row main decoder circuit 220 from selecting a wordline corresponding to an invalid address latched by the row address latch circuit 230. In other words, the controller 340 operates to maintain the row main decoder circuit 220 in a disabled state when a noise spike or other abnormally short XCEB signal is detected. At the same time, the controller 340 disables the chip enable flag signal ICE that would have been improperly enabled in typical FRAM devices by the noise spike in the XCEB signal. If, on the other hand, the external chip enable signal XCEB is normally enabled, the controller 340 enables the row main decoder circuit 220. The controller 340 subsequently disables the chip enable flag signal ICE after a predetermined time required for the read/write operation has passed.

According to those control methods, the FRAM device of the present invention is able to prevent an unnecessary read/write operation caused when the external chip enable signal XCEB is abnormally enabled.

Figure 5:
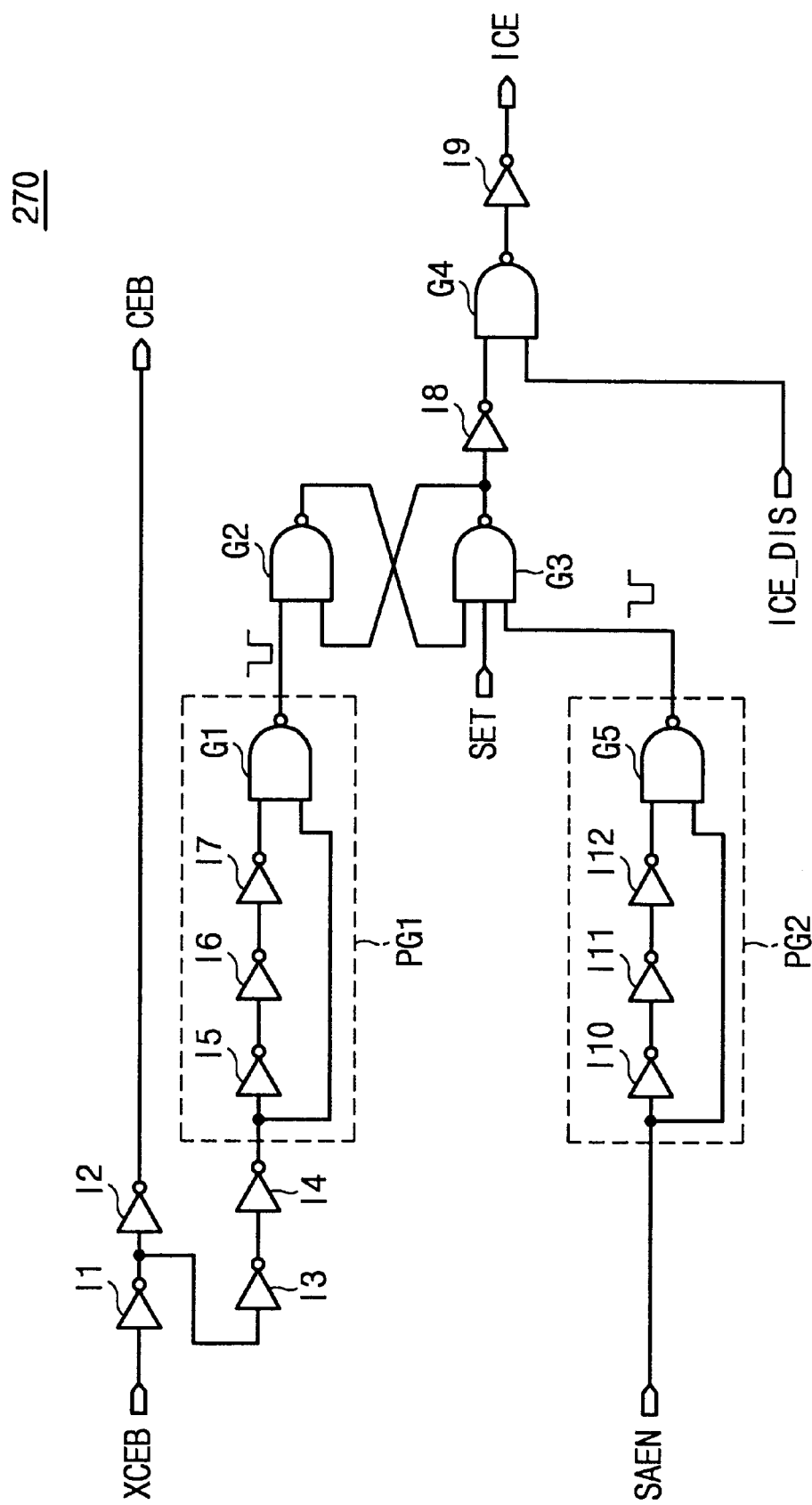
FIG. 5 is a schematic diagram of a chip enable buffer circuit shown in FIG. 4 constructed according to a preferred embodiment of the present invention.

FIG. 5 is a schematic view of the chip enable buffer circuit 270 according to a preferred embodiment of the present invention. Referring to FIG. 5, the chip enable buffer circuit 270 includes six inverters I1, I2, I3, I4, I8 and I9, three NAND gates G2, G3, and G4, and two pulse generators PG1 and PG2. The inverters I1 and I2 function as a buffer, the rest of the components function as a flag signal generating circuit. The chip enable buffer circuit 270 enables the chip enable flag signal ICE from low level to high level when the external chip enable signal XCEB transitions from high level to low level, and provide a buffered version of a chip enable signal CEB. Though the external chip enable signal XCEB is disabled by a subsequent low-to-high level transition, the enabled chip enable flag signal ICE is maintained at a high level. The chip enable flag signal ICE is disabled when a control signal SAEN, provided from a read/write control circuit 280, transitions from low level to high level, or the control signal ICE__DIS provided from the controller 340 transitions from high level to low level.

Figure 6:
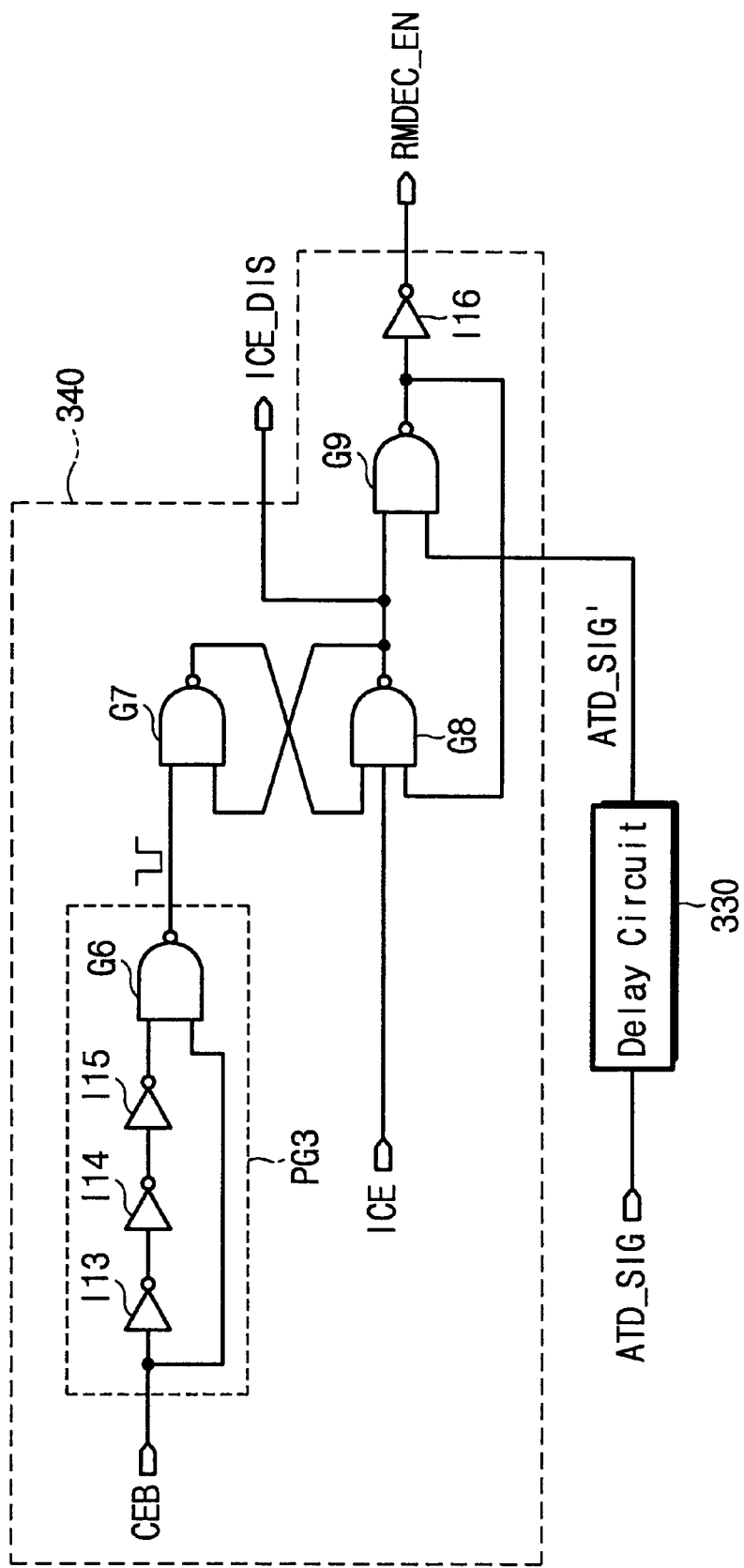
FIG. 6 is a schematic diagram of a controller shown in FIG. 4.

A preferred embodiment of the controller 340 in used in the present invention is illustrated in FIG. 6. Referring to FIG. 6, the controller 340 includes a pulse generator PG3, an inverter 116, and three NAND gates G7, G8, and G9. The pulse generator PG3 and the NAND gates G7 and G8 comprise a detection circuit to create a detection signal as the control signal ICE__DIS by detecting whether the buffered version of the chip enable signal CEB transitions from an enabled state to a disabled state. The NAND gate G9 and the inverter I16 comprise a logic circuit to create the control signal RMDEC__EN for controlling the enable/disable operation of the row main decoder circuit 220 in response to the control signal ICE DIS of the detection circuit and the delayed version of the detection pulse signal ATD__SIG'.

The controller 340 generates the control signals ICE__DIS and RMDEC__EN in response to the buffered version of the chip enable signal CEB and the chip enable flag signal ICE, and the delayed version of the detection pulse signal ATD__SIG', provided from the chip enable buffer circuit 270 and the delay circuit 330 respectively. More specifically, when each of the signals ATD__SIG' and ICE is at a low level and the signal CEB is at a high level, the controller 340 produces the control signal RMDEC_EM at a low level and the control signal ICE DIS at a high level. In such signals are at these levels, the row main decoder circuit 220 is maintained in a disabled state by the low-leveled control signal RMDEC__EN.

Thereafter, though each of the signals CEB and ICE has a high-to-low and low-to-high high transitions, i.e. when the external chip enable signal XCEB transitions from high level to low level, each of the control signals RMDEC__EN, and ICE__DIS maintains the low level and the high level, respectively. The detection pulse signal ATD__SIG indicates a transition of at least one in-address signals latched in the row address latch circuit 230 in accordance with the low-to-high transition of the chip enable flag signal ICE. The ATD__SIG detection pulse signal is then delayed for a predetermined time in the delay circuit 330 and the delayed signal ATD__SIG' is applied to the NAND gate G9. Accordingly, the control signal RMDEC__EN is enabled from low level to high level, and thereby the row main decoder circuit 220 is enabled to select a predetermined row.

If the buffered version of the chip enable signal CEB transitions from low level to high level before the delayed version of the detection pulse signal ATD__SIG' is applied to the NAND gate G9, then it is most likely that noise has occurred and the control signal ICE__DIS then transitions from high level to low level. Thus, the chip enable flag signal ICE, provided from the chip enabled buffer circuit 270 shown in FIG. 5, transitions from high level to low level, and the internal operation of the FRAM device is terminated. Thereafter, though the delayed version of the detection pulse signal ATD__SIG' is applied to the NAND gate G9, the control signal RMDEC__EN remains at a low level due to the control signal ICE__DIS at low level. Consequently, the row main decoder circuit 220 is maintained in a disabled state.

Figure 7:
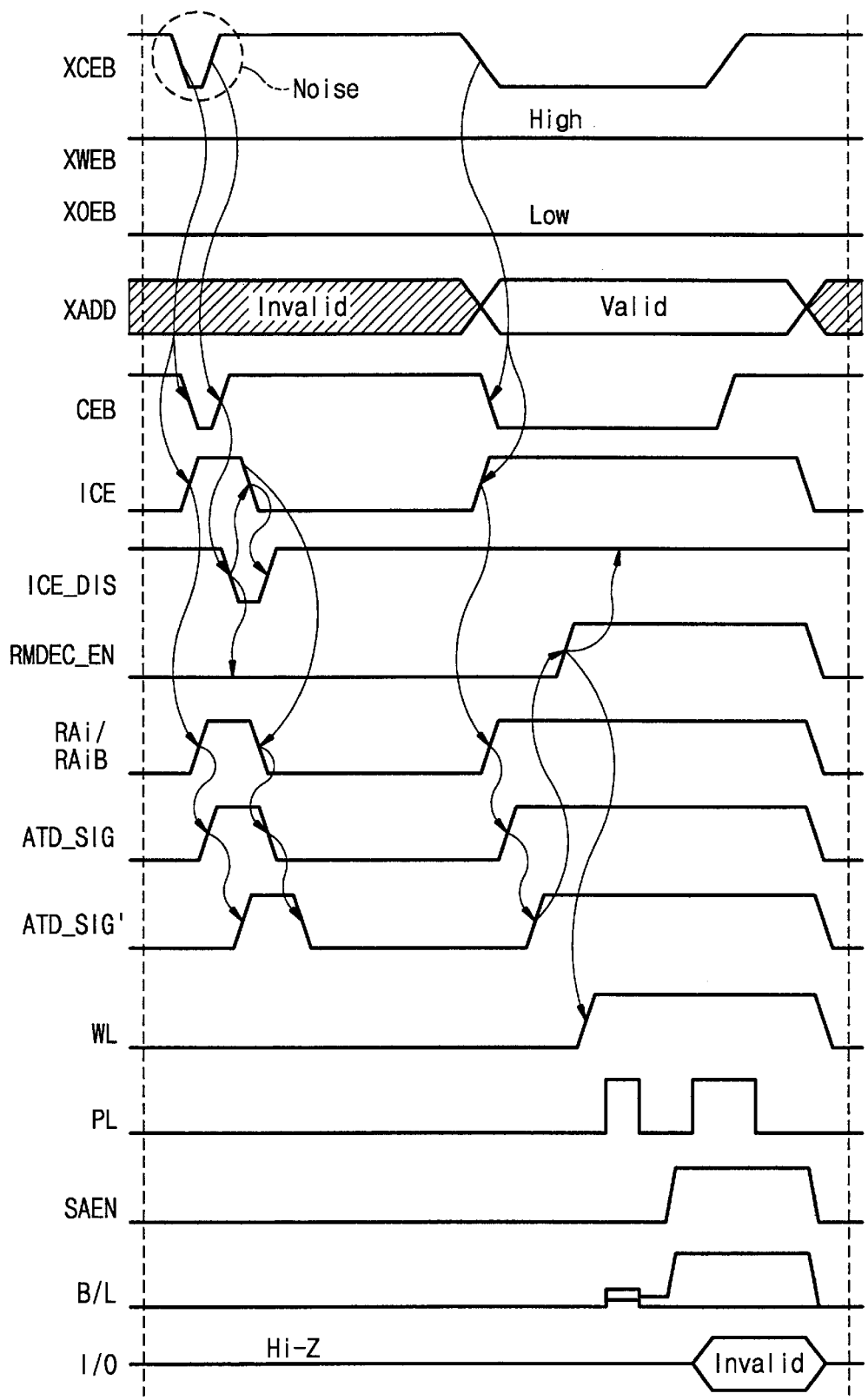
FIG. 7 is a timing diagram showing a write operation according to a preferred embodiment of the present invention.

FIG. 7 is a timing diagram showing an operation of the FRAM device of the present invention. When the external chip enable signal XCEB transitions from high level to low level, the chip enable buffer circuit 270 provides the buffered version of the chip enable signal CEB in response to the signal XCEB, and concurrently enables the chip enable flag signal ICE to be high level from low level. At that time, the row address latch circuit 230 and the column address latch circuit 240 respectively latch a corresponding address in response to the chip enable flag signal ICE being at a high level.

As shown in FIG. 7 the external chip enable signal XCEB has a short pulse, and thereby an undesirable operation may be performed.

The address transition detection circuit 320 detects whether or not at least one of address signals RAi/RAiB latched in the row address latch circuit 230 transitions, and, as a result, generates the detection pulse signal ATD_SIG. And the detection pulse signal ATD_SIG is delayed for a predetermined time by the delay circuit 330.

If the external chip enable signal XCEB is disabled by undergoing a low-to-high transition before the controller 340 receives the delayed version of the detection pulse signal ATD_SIG', an output signal of the pulse generator PG3 of the controller 340 transitions from high level to low level in response to the buffered version of the chip enable signal CEB which transitions from low level to high level. Therefore, an output signal ICE_DIS of the NAND gate G8 transitions from high level to low level, and concurrently, the control signal RMDEC_EN remains in the low level regardless of the delayed version of the detection pulse signal ATD_SIG'. Since the row main decoder circuit 220 remains in a disabled state when the control signal RMDEC_EN is at a low level, circuit 220 is prevented from selecting a random and thus invalid address otherwise latched by the noise. At the same time, the low-leveled control signal ICE_DIS is applied to the NAND gate G4 of the chip enable buffer circuit 270, and thereby the chip enable flag signal ICE is disabled by a high-to-low transition. The internal operation of the FRAM device is thus terminated.

Continuing to refer to FIG. 7, when the external chip enable signal XCEB is enabled again by a high-to-low transition, the chip enable buffer circuit 270 provides the buffered version of the chip enable signal CEB in response to the signal XCEB and concurrently enables the chip enable flag signal ICE to be high level from low level. At that time, the row address latch circuit 230 and the column address latch circuit 240 respectively latch a corresponding address in response to the chip enable flag signal ICE being at a high level. Then, the address transition detection circuit 320 shown in FIG. 4 detects whether or not at least one of the address signals RAi/RAiB latched in the row address latch circuit 230 transitions, and generates the consequent detection pulse signal ATD_SIG. The detection pulse signal ATD_SIG is delayed for a predetermined time by the delay circuit 330.

As the external chip enable signal XCEB is not disabled from low level to high level before the delayed version of the detection pulse signal ATD-SIG' is transferred to the controller 340, the control signal ICE_DIS remains in high level. Thereafter, when the controller 340 receives the delayed version of the detection pulse signal ATD_SIG', the control signal RMDEC_EN transitions from low level to high level. Accordingly, the row main decoder circuit 220 is enabled, and thereby the row main decoder circuit 220 selects a row corresponding to the address signals RAi/RAiB latched in the row address latch circuit 230.

According to the FRAM device of the present invention, a delay time of the delay circuit 330 may be modified in accordance with available applications of the device. For example, the delay time may be determined between several nanoseconds, or may be set according to an anticipated time interval range from latching the row address signal in the row address latch circuit 230 to selecting at least of one of the rows by the row main decoder circuit 220.

The FRAM device of the present invention thus prevents an unnecessary operation resulted from the external chip enable signal being abnormally enabled, and thereby improve the reliability of the FRAM device.

While the invention has been described in terms of an exemplary embodiment, it is contemplated that it may be practiced as outlined above with modifications within the spirit and scope of the appended claims.

What is claimed is:

1. A method for controlling a read/write operation of a ferroelectric random access memory (FRAM) device including an array consisted of a plurality of memory cells, arranged in rows and columns, each having a ferroelectric capacitor and an access transistor, the method comprising the steps of:

enabling a chip enable flag signal when a chip enable signal is enabled;

enabling a row address latch circuit to latch row address signals in response to the chip enable signal;

generating a pulse signal in response to at least one transition of the row address signals latched in the row address latch circuit;

delaying the pulse signal for a predetermined time;

detecting whether or not the chip enable signal is disabled during the predetermined delay time of the pulse signal; and preventing a row decoder circuit from enabling when the chip enable signal is disabled during the delay time of the pulse signal.

2. The method as claimed in claim 1, the method further comprising the steps of enabling the row decoder circuit to select one of the rows when the chip enable signal is not disabled during the delay time of the pulse signal.

3. The method as claimed in claim 1, further including the step of disabling the chip enable flag signal concurrently with the step of preventing the row decoder circuit from enabling.

4. The method as claimed in claim 1, wherein the delay time of the pulse signal is several nanoseconds.

5. The method as claimed in claim 1, wherein the delay time of the pulse signal corresponds to a time interval from latching of the row address signals to selecting at least one of the rows by the row decoder circuit.

6. A ferroelectric random access memory (FRAM) device comprising:

an array consisted of a plurality of memory cells, arranged in rows and columns, each having a ferroelectric capacitor and an access transistor;

an address latch circuit for latching a row address in response to a chip enable flag signal;

a row decoder circuit for selecting one of the rows by decoding the latched row address;

an address transition detection circuit for generating a pulse signal in response to a transition of the row address latched in the address latch circuit;

a flag signal generating circuit for generating the chip enable flag signal in response to an external chip enable signal;

a delay circuit for delaying the pulse signal for a predetermined time; and a controller for controlling the row decoder circuit and the flag signal generating circuit when the external chip enable signal is enabled, wherein after the external chip enable signal is enabled, the controller controls the row decoder circuit in a disabled state when the external chip enable signal is disabled during a delay time of the delay circuit, and controls the flag signal generating circuit to disable the chip enable flag signal.

7. The FRAM device claimed in claim 6, wherein the controller comprises:

a detection circuit for providing a detection signal by detecting whether or not the chip enable signal transitions from an enable state to a disable state; and a logic circuit for providing a control signal to control an enable/disable operation of the row decoder circuit in response to the detection signal and a delayed version of the pulse signal.

8. The FRAM device claimed in claim 7, wherein the detection signal is enabled when the chip enable signal transitions from a disable state to an enable state, while disabled when the chip enable signal transitions from an enable state to a disable state.

9. The FRAM device claimed in claim 7, wherein the logic circuit generates a first logic level control signal for maintaining the row decoder circuit in a disabled state regardless of the pulse signal if the detection signal is disabled prior to an input of the pulse signal, while generating a second logic level control signal for maintaining the row decoder circuit in an enabled state if the detection signal is disabled posterior to the input of the pulse signal.

10. The FRAM device claimed in claim 7, wherein the detection signal controls the flag signal generating circuit for disabling the chip enable flag signal.

11. The FRAM device claimed in claim 7, wherein the reversed version of the control signal feeds back to the detection circuit.

12. The FRAM device claimed in claim 7, wherein a delay time of the pulse signal is several nanoseconds.

13. The FRAM device claimed in claim 7, a delay time corresponds to a time interval from latching the address signals to selecting at least one of the rows by the row decoder circuit.

14. A method for controlling a read/write operation of a ferroelectric random access memory (FRAM) device, the method comprising the steps of:

detecting whether a chip enable signal has transitioned to a first state;

generating a pulse signal in response to the chip enable signal transition;

delaying the pulse signal for a delay time;

detecting whether or not the chip enable signal is disabled during the delay time of the pulse signal; and preventing a read/write operation from occurring when the chip enable signal is in a second state during the delay time of the pulse signal.

15. The method as claimed in claim 14, the method further comprising the step of allowing the read/write operation to occur when the chip enable signal remains in the first state during the delay time of the pulse signal.

* * * * *

UNITED STATES PATENT AND TRADEMARK OFFICE
CERTIFICATE OF CORRECTION

PATENT NO.    : 6,385,078 B2
DATED         : May 7, 2002
INVENTOR(S)   : Jeon

It is certified that error appears in the above-identified patent and that said Letters Patent is hereby corrected as shown below:

Column 1,
Line 48, "late line" should read -- plate line --.

Column 6,
Line 11, "116" should read -- I16 --.
Lines 20 and 32, "ICE DIS" should read -- ICE_DIS --.

Column 7,
Line 57, "ATD-SIG'" should read -- ATD_SIG' --.

Signed and Sealed this

Nineteenth Day of November, 2002

Attest:

JAMES E. ROGAN
Attesting Officer        Director of the United States Patent and Trademark Office